United States Patent [19]

Iwamoto et al.

[11] 4,350,963
[45] Sep. 21, 1982

[54] SURFACE ACOUSTIC WAVE DEVICE

[75] Inventors: Hisao Iwamoto; Noboru Wakatsuki, both of Kawasaki, Japan

[73] Assignee: Fujitsu Limited, Kawasaki, Japan

[21] Appl. No.: 219,948

[22] Filed: Dec. 24, 1980

[30] Foreign Application Priority Data

Dec. 27, 1979 [JP] Japan .................................. 54-169190

[51] Int. Cl.³ .................. H03H 9/145; H03H 9/25; H03H 9/42; H03H 9/64
[52] U.S. Cl. ............................ 333/151; 310/313 D; 333/153; 333/194; 333/195
[58] Field of Search ................................ 333/150–155, 333/193–196; 310/313 R, 313 A, 313 B, 313 C, 313 D; 331/107 A; 330/5.5

[56] References Cited

U.S. PATENT DOCUMENTS

| 4,004,254 | 1/1977 | Devries .............................. 333/153 |
| 4,096,455 | 6/1978 | Drummond ..................... 333/151 X |
| 4,146,851 | 3/1979 | Dempsey et al. ............... 333/195 X |
| 4,263,569 | 4/1981 | Moellmer ......................... 333/154 X |

FOREIGN PATENT DOCUMENTS

| 26114 | 4/1981 | European Pat. Off. . |
| 54-19635 | 2/1979 | Japan .................................. 333/151 |

Primary Examiner—Marvin L. Nussbaum
Attorney, Agent, or Firm—Staas & Halsey

[57] ABSTRACT

A surface acoustic wave device comprises a piezoelectric substrate, and an input transducer and an output transducer formed on the substrate. Dummy transducers are formed on the substrate and arranged to extend from the ends of the input and output transducers toward the ends of the substrate. The dummy transducers individually include electrodes spaced at the same pitch as the electrode pitch in the input and output transducers. Accordingly, there is no occurrence of reflections of the surface acoustic wave at the ends of the input and output transducers.

17 Claims, 17 Drawing Figures

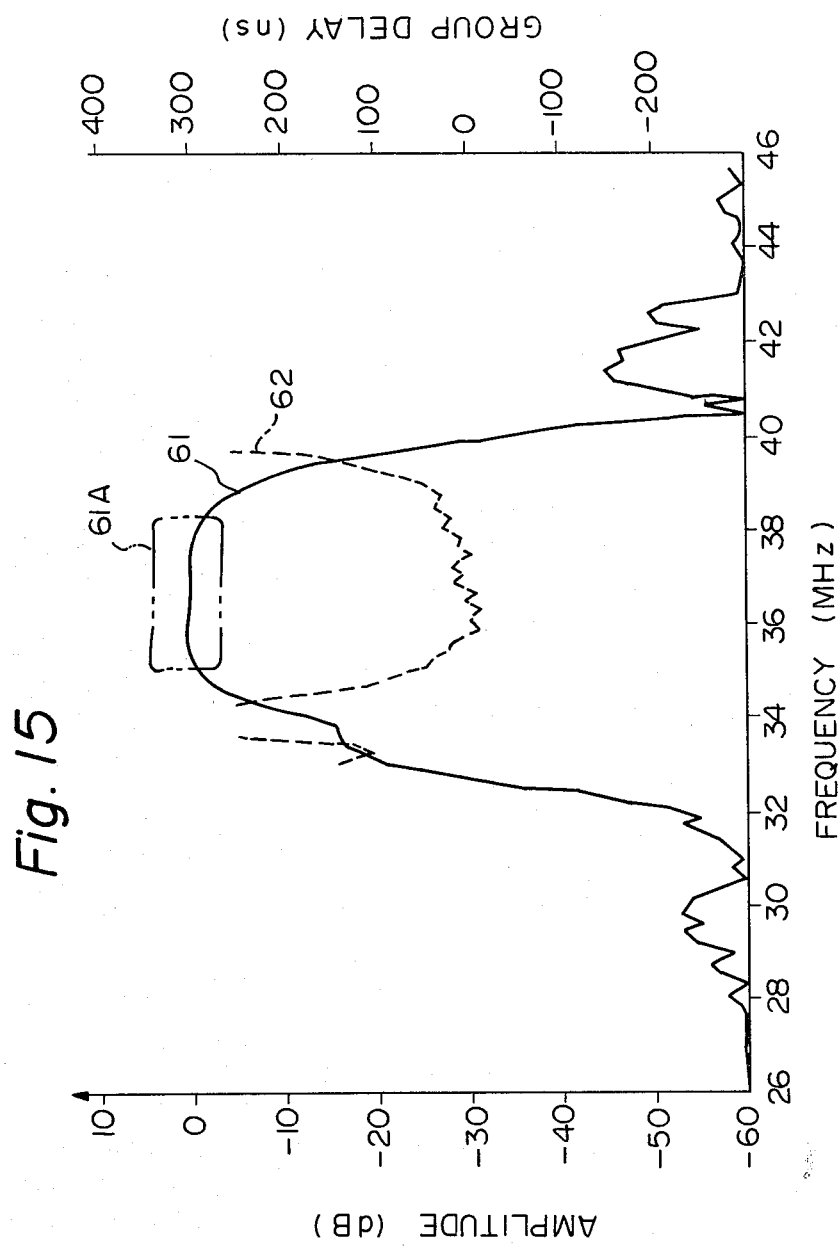

SURFACE ACOUSTIC WAVE DEVICE

BACKGROUND OF THE INVENTION

The present invention relates to a surface acoustic wave device.

Recently, surface acoustic wave devices have been used as band pass filters delay lines, or the like. Some examples of conventional surface acoustic wave devices will be described below with reference to FIGS. 1 through 3, of the accompanying drawings.

FIG. 1 illustrates a fundamental construction of a surface acoustic wave device serving as a band pass filter. This surface acoustic wave device comprises a substrate 1, which is made of a piezoelectric material, such as lithium niobate ($LiNbO_3$) or lithium tantalate ($LiTaO_3$), and is provided on the surface thereof with an input transducer 2 and an output transducer 3, each of which is composed of a pair of interdigitated comb-like electrodes made of a thin film of metal. When electrical signals from a generator 4 are applied to the electrodes of the input transducer 2, the latter emits surface acoustic waves 5, which are propagated to the output transducer 3 and then converted into other electrical signals which can be taken out from a load impedance 6. The electrodes of the input and output transducers can be designed in a variety of patterns, so as to provide various desired characteristics to the filter when electrical signals are converted into acoustic signals or vice versa. However, there is a problem in that the input transducer emits bulk waves, in addition to surface acoustic waves, which bulk waves are propagated through the body of the substrate to reach the output transducer, thereby adversely affecting the output characteristics of the latter.

In order to eliminate the above mentioned problem, in another conventional device illustrated in FIG. 2, the input transducer 2 and the output transducer 3 are arranged diagonally opposite each other, and a multistrip coupler 7, which includes a plurality of parallel conductors, is provided between the input and output transducers. According to this arrangement, the path of propagation of the surface acoustic waves is changed as indicated by a solid arrow, and as a result, the effect of the bulk waves which are propagated as indicated by a dotted arrow, is eliminated.

In the conventional surface acoustic devices as mentioned above, however, there is a further problem in that a number of reflections of the surface acoustic wave occur and deteriorate the filter characteristics. It has been found from the results of some experiments that the reflections of the surface acoustic wave include reflections from portions of acoustical discontinuity on the substrate surface, such as, for example, reflections 10 and 10' from the ends of the multistrip coupler 7 and the output transducer 3 as illustrated in FIG. 3.

SUMMARY OF THE INVENTION

It is an object of the present invention to provide a surface acoustic wave device in which the reflections of the surface acoustic wave from portions of acoustical discontinuity on the substrate surface can be effectively suppressed and to provide a device which has good frequency characteristics.

According to an aspect of the present invention, there is provided a surface acoustic wave device comprising a piezoelectric substrate, and input and output transducers formed on said substrate and being individually composed of a pair of comb-like electrodes, wherein said device further comprises dummy transducers formed on said substrate and arranged to extend from the outer ends of said input and output transducers toward the ends of said substrate, respectively, said dummy transducers individually including a plurality of electrodes spaced at substantially the same pitch as the electrode pitch in the respective input and output transducers.

According to another aspect of the present invention, there is provided a surface acoustic wave device comprising a piezoelectric substrate, input and output transducers formed on said substrate and arranged diagonally opposite each other, said input and output transducers individually being composed of a pair of comb-like electrodes, and a multistrip coupler formed on said substrate and inter-posed between said input and output transducers and including a plurality of filamentary conductors, wherein said device further comprises dummy transducers formed on said substrate and arranged to extend from the outer ends of said input and output transducers toward the ends of said substrate, respectively, said dummy transducers individually including a plurality of electrodes spaced at substantially the same pitch as the electrode pitch in the respective input and output transducers.

It is preferred that the device according to another aspect of the present invention further comprises dummy transducers formed on said substrate and arranged to extend from the opposite ends of said multistrip coupler toward the ends of said substrate, respectively, said dummy transducers individually including a plurality of electrodes spaced at substantially the same pitch as the conductor pitch of said multistrip coupler.

The present invention will become more apparent from the description of preferred embodiments set forth below with reference to the accompanying drawings.

BRIEF DESCRIPTION OF THE DRAWINGS

FIGS. 15 and 15A are graphs illustrating frequency characteristics of the surface acoustic wave device according to the present invention.

DESCRIPTION OF THE PREFERRED EMBODIMENTS

Figure 4:
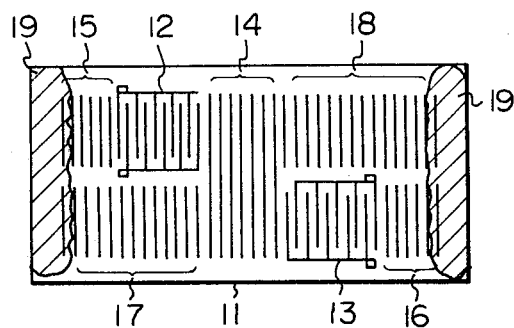
FIG. 4 is a plan view of a first embodiment of a surface acoustic wave device according to the present invention.

Referring to FIG. 4, a first embodiment of a surface acoustic wave device according to the present invention comprises a substrate 11 which is made of a piezoelectric material. The substrate 11 is provided on a plane surface thereof with an input transducer 12, an output transducer 13, a multistrip coupler 14, and dummy transducers 15, 16, 17 and 18, which elements are formed, for example, by etching a vapor-deposited thin film of aluminum by means of photolithographic technology.

The input transducer 12 and the output transducer 13 are arranged diagonally opposite each other with the multistrip coupler 14 therebetween. Each of the input and output transducers 12 and 13 is composed of a pair of interdigitated comb-like electrodes and has a construction in which the pitch (i.e. center-to-center spacing) of the electrodes is about $\lambda/4$ and the width of the electrodes is about $\lambda/8$, where $\lambda$ is a wavelength at the center frequency of the surface acoustic wave. The multistrip coupler 14 is arranged so as to be substantially orthogonal to the propagation direction of the surface acoustic wave, and includes a plurality of parallel filamentary conductors.

The dummy transducer 15 is arranged to extend from the outer end of the input transducer 12 toward one end of the substrate 11 and includes a plurality of electrodes spaced at substantially the same pitch as the electrode pitch in the input transducer 12. The dummy transducer 16 is arranged to extend from the outer end of the output transducer 13 toward the opposite end of the substrate 11 and includes a plurality of electrodes spaced at substantially the same pitch as the electrode pitch in the output transducer 13. The dummy transducers 17 and 18 are arranged to extend from the opposite ends of the multistrip coupler 14 toward the opposite ends of the substrate 11, respectively, and each includes a plurality of electrodes spaced at substantially the same pitch as the conductor pitch in the multistrip coupler 14. The opposite ends of the substrate 11 are applied with acoustic absorption materials 19, such as phenolic resin or oleoresin, for example, which cover the outer end portions of the dummy transducers 15 through 18.

In the first embodiment constructed as mentioned above, the surface acoustic waves reaching the ends of the multistrip coupler 14 and the output transducer 13 are then propagated through the dummy transducers 18 and 16, respectively, and, finally, absorbed by the acoustic absorption material 19. As a result, there is no occurrence of the reflections of the surface acoustic wave from the ends of the multistrip coupler 14 and the output transducer 13. The other dummy transducers 15 and 17 also provide substantially the same effects as mentioned above.

Figure 5:
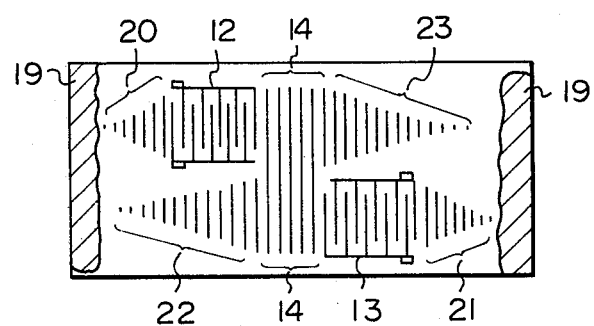
FIG. 5 is a plan view of a second embodiment according to the present invention.

Referring to FIG. 5, a second embodiment of the present invention is basically similar to the first embodiment described previously, but comprises, instead of the dummy transducers 15 through 18, dummy transducers 20, 21, 22 and 23. The electrodes of the individual dummy transducers 20 through 23 are formed to be successively shorter in length toward the end of the substrate 11, so that each individual dummy transducer is formed in the shape of a rope end.

In the second embodiment constructed as mentioned above, the surface acoustic waves reaching the ends of the multistrip coupler 14 and the output transducer 13 are propagated through the dummy transducers 23 and 21, respectively, and, then, are dampered gradually due to the slight reflections from the successively varied lengths of the electrodes of the dummy transducers. Therefore, as in the first embodiment mentioned previously, there is no occurrence of the reflections of the surface acoustic wave from the ends of the multistrip coupler 14 and the output transducer 13, respectively.

Figure 1:
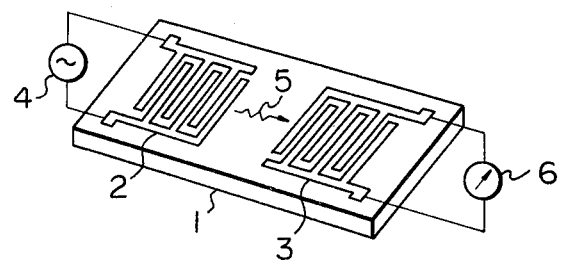
FIG. 1 is a perspective view illustrating a conventional typical surface acoustic wave device.
Figure 2:
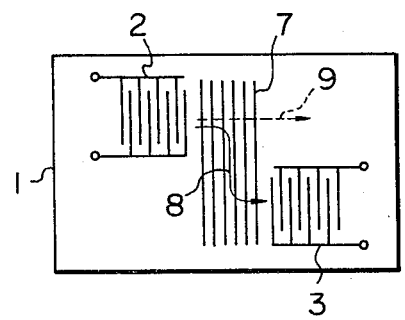
FIG. 2 is a plan view illustrating a conventional surface acoustic wave device provided with a multistrip coupler.
Figure 3:
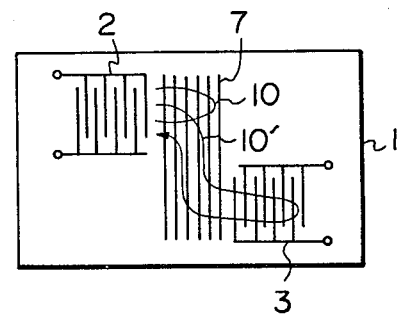
FIG. 3 is a view used to explain the reflections of the surface acoustic wave in the conventional surface acoustic wave device in FIG. 2.
Figure 6:
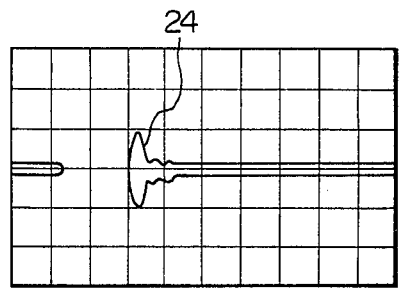
FIGS. 6 through 9 are oscillograms of experimental results.
Figure 7:
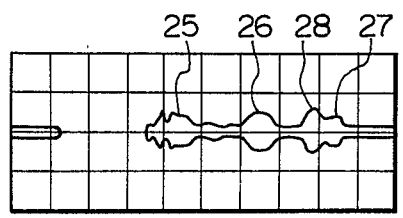
Figure 8:
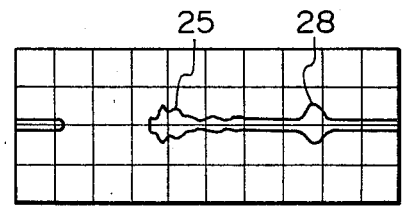
Figure 9:
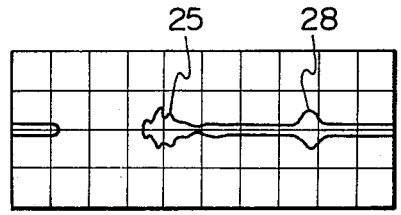

FIGS. 7 through 9 are oscillograms of reflected waves in an experiment, in which a pulse 24 illustrated in FIG. 6 is applied to the conventional filter in FIG. 2 and the first and second embodiments of the present invention in FIGS. 4 and 5. It will be understood from these figures that the reflected wave in the conventional filter in FIG. 2 (FIG. 7) includes a reflection 25 from the inner end of the input transducer, a reflection 26 from the end of the multistrip coupler, a reflection 27 from the outer end of the output transducer and a reflection 28 from the entire output transducer. Contrary to this, both reflected waves in the first and second embodiments of the present invention (FIGS. 8 and 9) do not include the reflections 26 and 27 from the end of the multistrip coupler and the output transducer.

Figure 10:
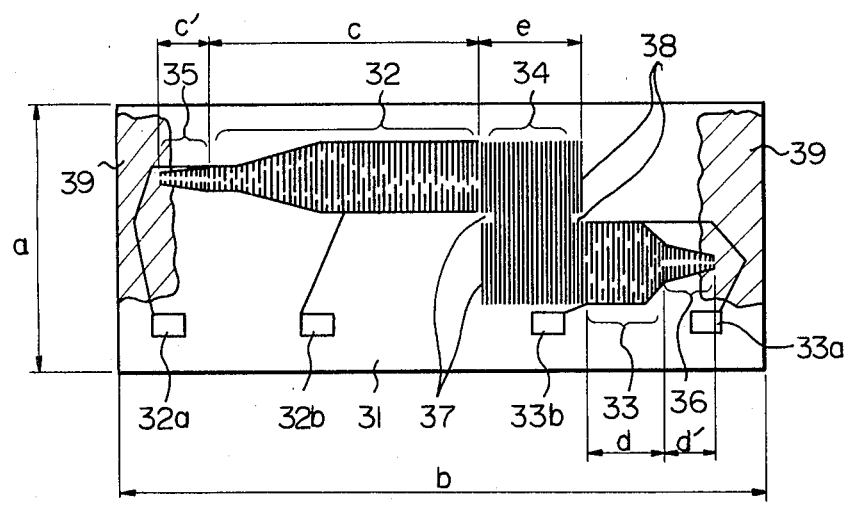
FIG. 10 is a plan view of a third embodiment according to the present invention.

Referring to FIG. 10, a third embodiment of the present invention comprises a piezoelectric substrate 31 which is provided on the surface thereof with an input transducer 32, an output transducer 33, a multistrip coupler 34, dummy transducers 35 and 36 and dummy couplers 37 and 38. The input and output transducers 32 and 33 and the multistrip coupler 34 are basically similar to those in the conventional device mentioned previously, but the electrodes of the input and output transducers 32 and 33 are weighted to provide desired frequency characteristics. The dummy transducer 35 is arranged to extend from the outer end of the input transducer 33 toward the end of the substrate 31 and includes a plurality of electrodes spaced at substantially the same pitch as the electrode pitch in the input transducer 32. The dummy transducer 36 is arranged to extend from the outer end of the output transducer 33 toward the end of the substrate 31 and includes a plurality of electrodes spaced at substantially the same pitch as the electrode pitch in the output transducer 33. The dummy coupler 37 is interposed between the input transducer 32 and the multistrip coupler 34 and includes a plurality of conductors spaced at substantially the same pitch as the electrode pitch of the input transducer 32 or the conductor pitch of the multistrip coupler 34. The dummy coupler 38 is interposed between the output transducer 33 and the multistrip coupler 34 and includes a plurality of conductors spaced at substantially the same pitch as the electrode pitch of the output transducer 33 or the conductor pitch of the multistrip coupler 34. The opposed ends of the substrate 31 is applied with acoustic absorption materials 39, such as phenolic resin or oleoresin, which cover the outer end portions of the dummy transducers 35 and 36.

Figure 11:
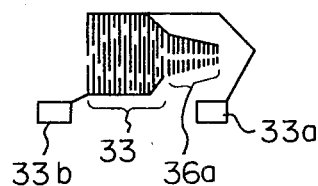
FIG. 11 is a view illustrating a variation of a dummy transducer.
Figure 12:
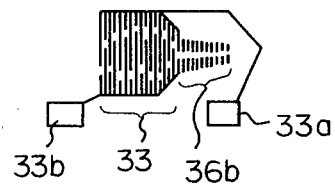
FIG. 12 is a view illustrating another variation of a dummy transducer.

It should be noted that each of the electrodes of the dummy transducer 35 is connected by the opposed lateral ends to the electrode terminals 32a and 32b of the input transducer 32, and each of the electrodes of the dummy transducer 36 is connected by the opposed lateral ends to the electrode terminals 33a and 33b of the output transducer 33. However, either or both of the opposed lateral ends of each electrode of the dummy transducer may be opened. For example, FIG. 11 illustrates a variation 36a of the dummy transducer 36, in which only one lateral end of each electrode is connected to the terminal 33a. Furthermore, FIG. 12 illustrates another variation 36b of the dummy transducer 36, in which both lateral ends of each electrode are opened.

In the third embodiment constructed as mentioned above, the surface acoustic wave reaching the end of the output transducer 33 is propagated through the dummy transducer 36 and, then, absorbed by the acoustic absorption material 39. Therefore, there is no occurrence of the relfection of the surface acoustic wave from the end of the output transducer 33. Furthermore, the surface acoustic wave reaching the inner end of the input transducer 32 is propagated through the dummy coupler 37 to the multistrip coupler 34, and accordingly the reflection 25 from the inner end of the input transducer as illustrated in FIGS. 7 through 9 is prevented from occurring. The dummy transducer 35 and the dummy coupler 38 provides substantially the same effects as mentioned above.

The frequency characteristics of the third embodiment of the present invention in FIG. 10 will be described below, in comparison with that of a conventional device similar to this third embodiment, but without the dummy transducers 35 and 36 and without the dummy couplers 37 and 38. The device of the present invention and the conventional device each has a center frequency of 36 MHz and a frequency band of 7 MHz, and is constructed with the following dimensions.

Figure 13:
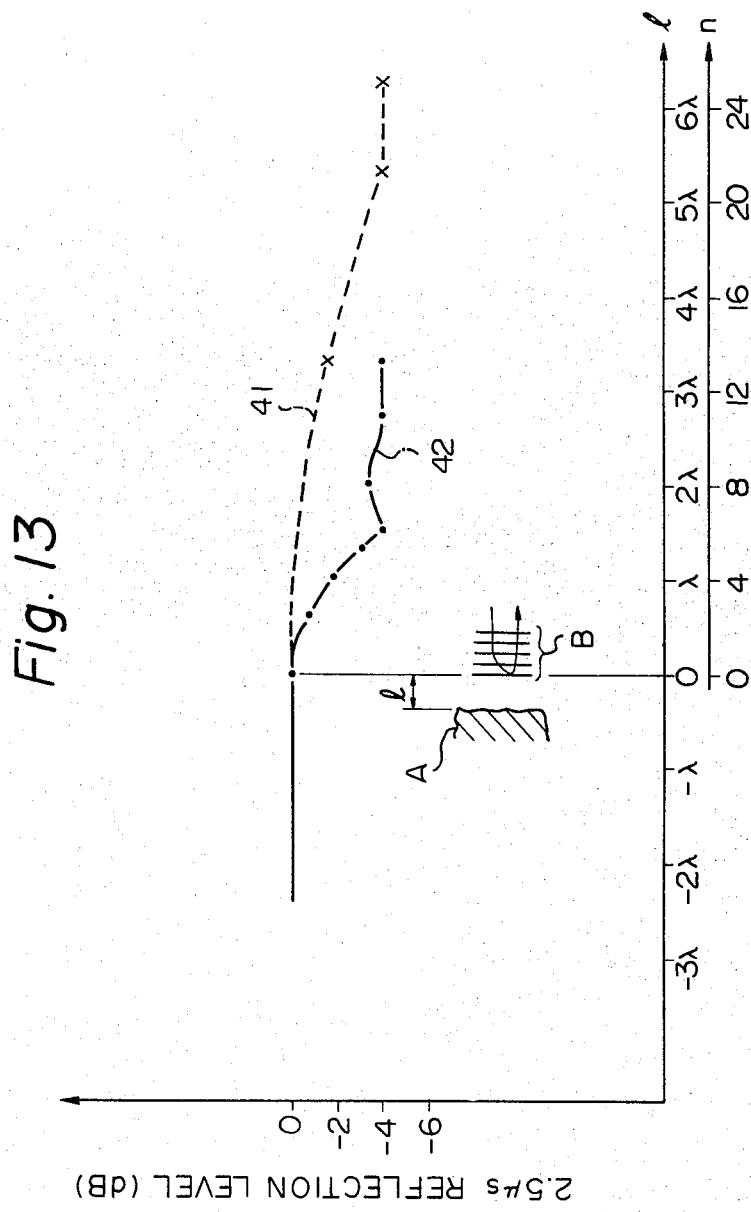
FIG. 13 is a view used to explain the effect of an acoustic absorption material.

(1) General dimensions
  a=3,500μ
  b=11,500μ
  c=4,750μ
  c'=800μ
  d=1,400μ
  d'=800μ
  e=1,700μ
(2) Input transducer 32
  Number of electrodes:180
  Pitch of electrodes:26.5μ
  Width of electrode:13μ
  Cross-width:1.05 mm
(3) Output transducer 33
  Number of electrodes:50
  Pitch of electrodes:28μ
  Width of electrode:14μ
  Cross-width:1.25 mm
(4) Multistrip coupler 34
  Number of conductors:69
  Pitch of conductors:23μ
  Width of conductor:13μ
  Length:2.7 mm
(5) Dummy transducer 35
  Number of electrodes:30
  Pitch of electrodes:26.5μ
  Width of electrode:13μ
(6) Dummy transducer 36
  Number of electrodes:30
  Pitch of electrodes:28μ
  Width of electrodes:14μ
(7) Dummy coupler 37 or 38
  Number of electrodes:3
  Pitch of electrodes:23μ
  Width of electrodes:11.5μ
  Length of electrodes:1.35 mm In addition, the acoustic absorption material 39, for example, phenolic resin can be applied according to the experimental results illustrated in FIG. 13. In FIG. 13, the abscissa represents the distance "l" between the end of the acoustic absorption material A and the end of the dummy transducer B (l<0, when the acoustic absorption material is apart from the dummy transducer: l>0, when the acoustic absorption material covers the dummy transducer) and the number "n" ($=4\times l/\lambda$) of electrodes of the dummy transducer B which are covered with the acoustic absorption material A, and the ordinate represents the 2.5 μs reflection level. The curves 41 (dotted line) and 42 (chain-dotted line) were obtained when the thickness of the acoustic absorption material A is of 22μ and of more than 50μ, respectively. As will be obvious from FIG. 13, the larger the number "n" is, the smaller the 2.5 μs reflection level is. However, when n>21 in the case of the curve 41 or when n>6 in the case of the curve 42, the 2.5 μs reflection level is approximately constant.

Figure 14:
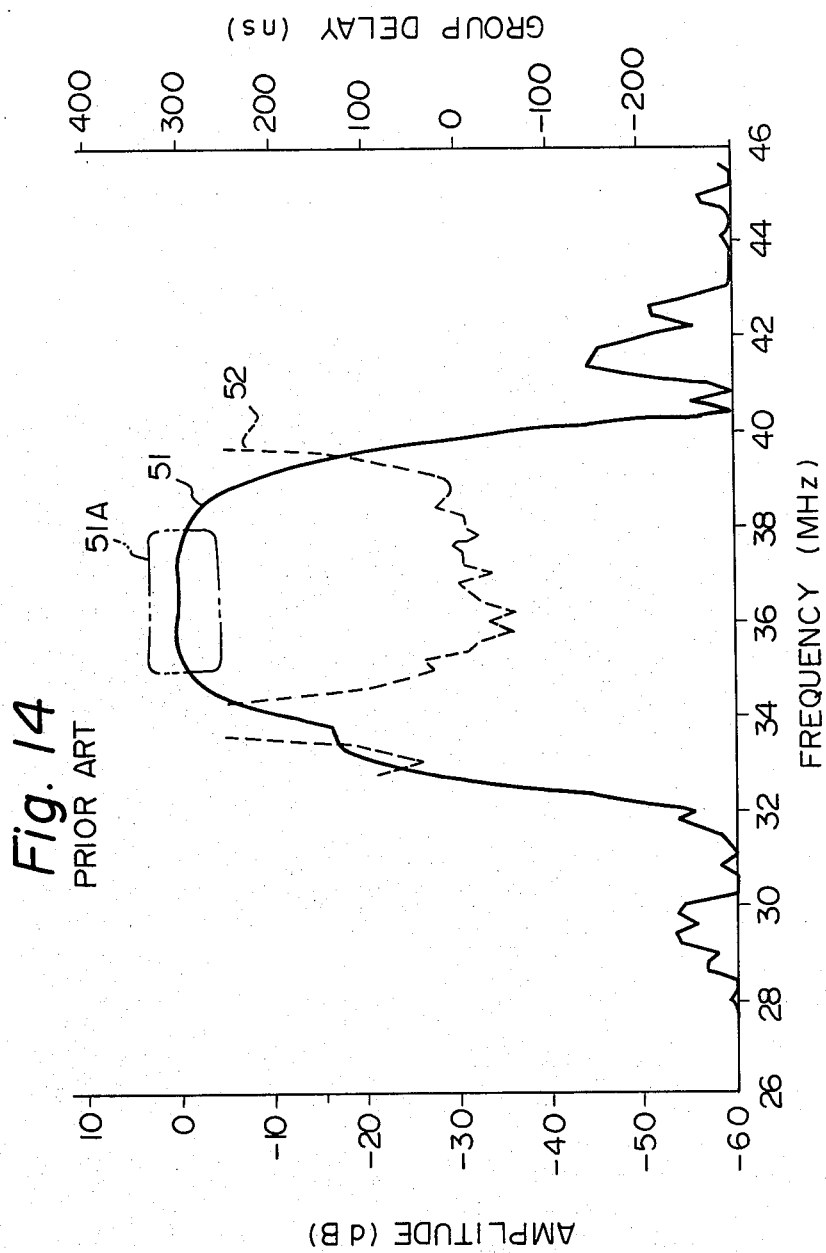
FIGS. 14 and 14A are graphs illustrating frequency characteristics of a conventional surface acoustic wave device.
Figure 14A:
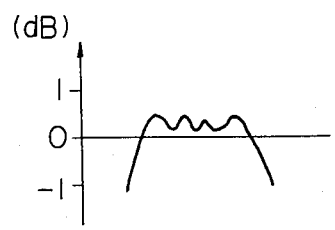
Figure 15A:
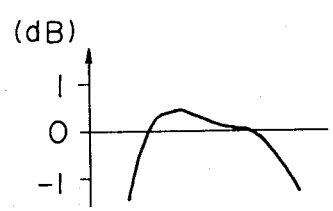

The frequency characteristics of the conventional device and the device of the present invention, constructed as mentioned above, are illustrated in FIGS. 14 and 14A and FIGS. 15 and 15A, respectively. In FIGS. 14 and 15, the abscissa represents the frequency, the left ordinate represents the amplitude in relation with a curve 51 or 61, and the right ordinate represents the group delay in relation with a curve 52 or 62. It should be noted that FIGS. 14A and 15A illustrate the portions 51A and 61A of the curves 51 and 61 in the FIGS. 14 and 15, respectively, with a magnified scale of ordinate. It will be understood from these figures that the ripples of the amplitude and group delay are large in the conventional device, and, contrary to this, small in the device of the present invention. Accordingly, good frequency characteristics can be provided.

It should be appreciated that the invention has been described above in detail with particular reference to the preferred embodiments thereof, but variations and modifications can be made thereto without changing the scope of the invention.

We claim:
1. A surface acoustic wave device comprising:
a piezoelectric substrate;
input and output transducers formed on said substrate and arranged diagonally opposite each other, said input and output transducers individually including a pair of comb-like electrodes;
a multistrip coupler formed on said substrate and interposed between said input and output transducers, said coupler including a plurality of filamentary conductors;
dummy transducers formed on said substrate and arranged to extend from the outer ends of said input and output transducers toward the ends of said substrate, respectively, said dummy transducers individually including a plurality of electrodes spaced at substantially the same pitch as the electrode pitch in the respective input and output transducers; and
dummy transducers formed on said substrate and arranged to extend from the opposite ends of said multistrip coupler toward the ends of said substrate, respectively, said dummy transducers individually including a plurality of electrodes spaced at substantially the same pitch as the conductor pitch in said multistrip coupler.

2. A device according to claim 1, wherein said device further comprises acoustic absorption material applied onto said substrate to cover at least the outer end portions of said dummy transducers.

3. A device according to claim 2, wherein said acoustic absorption material is a phenolic resin.

4. A device according to claim 2, wherein said acoustic absorption material is an oleoresin.

5. A device according to claim 1, wherein the electrodes of the individual dummy transducers are formed to be successively shorter toward the end of the substrate, whereby each individual dummy transducer is formed in the shape of a rope end.

6. A device according to claim 1, wherein said electrodes of the dummy transducers are short-circuited at opposite ends of the individual electrodes.

7. A device according to claim 1, wherein said electrodes of the dummy transducers are short-circuited at one end of the individual electrodes.

8. A device according to claim 1, wherein said electrodes of the dummy transducers are opened at both ends of the individual electrodes.

9. A device according to claim 1, wherein said device further comprises dummy couplers formed on said substrate between said input and output transducers and said multistrip coupler, respectively, said dummy couplers individually including a plurality of conductors spaced at substantially the same pitch as the electrode pitch in the respective input and output transducers, or the conductor pitch in the multistrip coupler.

10. A surface acoustic wave device comprising:
a piezoelectric substrate;
input and output transducers formed on said substrate and arranged diagonally opposite each other, said input and output transducers individually including a pair of comb-like electrodes;
a multistrip coupler formed on said substrate and interposed between said input and output transducers, said coupler including a plurality of filamentary conductors;
dummy transducers formed on said substrate and arranged to extend from the outer ends of said input and output transducers toward the ends of said substrate, respectively, said dummy transducers individually including a plurality of electrodes spaced at substantially the same pitch as the electrode pitch in the respective input and output transducers; and
dummy couplers formed on said substrate between said input and output transducers and said multistrip coupler, respectively, said dummy couplers individually including a plurality of conductors spaced at substantially the same pitch as the electrode pitch in the respective input and output transducers, or the conductor pitch in the multistrip coupler.

11. A device according to claim 10, wherein said device further comprises acoustic absorption material applied onto said substrate to cover at least the outer end portions of said dummy transducers.

12. A device according to claim 11, wherein said acoustic absorption material is a phenolic resin.

13. A device according to claim 11, wherein said acoustic absorption material is an oleoresin.

14. A device according to claim 10, wherein the electrodes of the individual dummy transducers are formed to be successively shorter toward the end of the substrate, whereby each individual dummy transducer is formed in the shape of a rope end.

15. A device according to claim 10, wherein said electrodes of the dummy transducers are short-circuited at opposite ends of the individual electrodes.

16. A device according to claim 10, wherein said electrodes of the dummy transducers are short-circuited at one end of the individual electrodes.

17. A device according to claim 10, wherein said electrodes of the dummy transducers are opened at both ends of the individual electrodes.

* * * * *

UNITED STATES PATENT AND TRADEMARK OFFICE
CERTIFICATE OF CORRECTION

PATENT NO. : 4,350,963

DATED : Sep. 21, 1982

INVENTOR(S) : Iwamoto et al.

It is certified that error appears in the above-identified patent and that said Letters Patent is hereby corrected as shown below:

Column 2, line 51, after "invention;" begin new paragraph with "FIG. 5".

Signed and Sealed this

Fifteenth Day of February 1983

[SEAL]

Attest:

GERALD J. MOSSINGHOFF

Attesting Officer

Commissioner of Patents and Trademarks